(12) United States Patent
Bäcker et al.

(10) Patent No.: US 6,830,839 B1
(45) Date of Patent: Dec. 14, 2004

(54) METHOD FOR COATING A SEMICONDUCTOR MATERIAL USING HIGH REMANENT INDUCTION, COATED SUPERCONDUCTOR MATERIAL AND THE USE THEREOF

(75) Inventors: Michael Bäcker, Köln (DE); Joachim Bock, Erfstadt (DE); Herbert Freyhardt, Göttingen (DE); Andreas Leenders, Göttingen (DE); Martin Ullrich, Lahnau-Atzbach (DE); Heribert Walter, Göttingen (DE)

(73) Assignee: Nexans Superconductors GmbH, Huerth (DE)

( * ) Notice: Subject to any disclaimer, the term of this patent is extended or adjusted under 35 U.S.C. 154(b) by 0 days.

(21) Appl. No.: 09/914,156

(22) PCT Filed: Sep. 10, 1999

(86) PCT No.: PCT/EP99/06680

§ 371 (c)(1),
(2), (4) Date: Dec. 12, 2001

(87) PCT Pub. No.: WO00/52768

PCT Pub. Date: Sep. 8, 2000

(30) Foreign Application Priority Data

Feb. 27, 1999  (DE) .......................................... 199 08 597

(51) Int. Cl.⁷ ........................... H01F 6/00; B32B 19/00; B32B 9/00
(52) U.S. Cl. ....................................... 428/701; 505/126
(58) Field of Search ................................. 428/701, 702, 428/930; 505/121, 230, 705, 780

(56) References Cited

U.S. PATENT DOCUMENTS

| | | | | |
|---|---|---|---|---|
| 5,014,032 A | * | 5/1991 | Aubert ....................... | 335/306 |
| 5,168,096 A | * | 12/1992 | Tournier ..................... | 505/400 |
| 5,308,799 A | * | 5/1994 | Morita et al. ................ | 505/126 |
| 5,325,002 A | * | 6/1994 | Rabinowitz et al. ......... | 505/166 |
| 5,563,564 A | * | 10/1996 | Chu et al. .................... | 335/216 |
| 5,571,776 A | * | 11/1996 | Morita ........................ | 505/126 |
| 5,850,098 A | * | 12/1998 | Butler et al. ................. | 257/467 |
| 5,974,336 A | * | 10/1999 | Yamada et al. ............. | 505/230 |
| 6,025,769 A | * | 2/2000 | Chu et al. .................... | 335/216 |
| 6,060,433 A | * | 5/2000 | Li et al. ....................... | 505/473 |
| 6,083,885 A | * | 7/2000 | Weinstein .................... | 505/320 |

FOREIGN PATENT DOCUMENTS

| | | |
|---|---|---|
| DE | 42 43 053 A1 | 6/1993 |
| EP | 0 486 698 A1 | 5/1992 |
| EP | 0 837 513 A1 | 4/1998 |

OTHER PUBLICATIONS

Gawalek et al., "Remanent induction and levitation force of melt textured YBCO" 1994, Applied Superconductivity, vol. 2 No 7/ pp. 465–478.*

H. Ikuta et al, "Melt–compressed Sm–Ba–Cu–O superconductors tapping strong magnetic field" Superconductor Sci. Technol. 11 (1998) pp. 1345–1347.

M. Morita et al, "Trapped filed of $YBA_2 Cu_3 O_7$ QMG bulk magnets", Material Science and Engineering b53 (1998) pp. 159–163.

* cited by examiner

*Primary Examiner*—Tom Dunn
*Assistant Examiner*—Colleen P. Cooke
(74) *Attorney, Agent, or Firm*—Sughrue Mion, PLLC (57) ABSTRACT

The invention relates to a method for coating shaped bodies made of a superconducting material based on (Y/SE) BaCuO. The invention is characterized in that a coating consisting of a coating material is applied to at least one part of a surface of the shaped body, whereby the coating material at least partially melts at a lower temperature than that of the material of the shaped body and/or is flowable at a lower temperature than that of said material. The shaped body with the applied coating material is heated to a temperature at which the material of the shaped body does not yet melt and/or is not yet flowable, however at which the coating material is at least partially melted thereon and/or is in a flowable state. In addition, at least one part of the area of the shaped body located near the surface is modified at said temperature and/or during a successive cooling, and the shaped body treated in such a manner is enriched with oxygen during cooling and/or during a successive heat treatment, whereby the modification contributes to the increase in remanent induction and/or to the critical current density of the shaped body enriched with oxygen. The invention also relates to a shaped body made of a superconducting material which is based on (Y/SE)BaCuO and which can be obtained by using the above-mentioned method. Said superconducting material contains at least one rare-earth element selected from the group of Y, La, Ce, Pr, Nd, Eu, Gd, Tb, Dy, Ho, Er Tm, Yb and Lu and comprises a maximal value of remanent induction of at least 1100 mT at 77K and 0 T.

16 Claims, 3 Drawing Sheets

Figure 1

Before Infiltration
Bmax = 820 mT

Figure 2

After Infiltration
$B_{max}$ = 1026 mT

$B_{z,max} = 1226$ mT

Figure 5

METHOD FOR COATING A SEMICONDUCTOR MATERIAL USING HIGH REMANENT INDUCTION, COATED SUPERCONDUCTOR MATERIAL AND THE USE THEREOF

The invention relates to a method for the heat treatment of a superconductor material, the heat treated superconductor material based on (Y/Rare Earth) BaCuO having good material properties and especially a high remanent induction and which contains just one grain or just a few grains or one or more magnetic domains, and the use of the heat treated material.

When developing superconducting materials, the aim is to produce superconducting and magnetic properties which are as high as possible. There are particular advantages to be gained if texturised polycrystalline or superconducting materials comprising just one or just a few magnetic domains are employed. The magnetic properties thereof are best, when the shaped body only comprises one magnetic domain.

One particular field of employment for so-called massive shaped bodies made of high temperature superconductors is that of non-contact making, self-stabilising magnetic bearings. Such bearings contain arrangements of permanent magnets and high temperature superconducting shaped bodies:

If a high temperature superconducting shaped body is located in the field of a permanent magnet at a temperature above its transition temperature $T_c$, then a magnetic flux will pass therethrough. If, in this case, the superconductor is cooled to temperatures below the transition temperature then a portion of the magnetic flux will remain frozen into the superconducting material. In this state, it is only possible to displace the high temperature superconducting shaped body by the application of force. The stability of such a bearing is so much the greater, the larger the amount of magnetic flux that can be frozen into the superconducting material, i.e. the higher the maximum value of the remanent induction.

Improved magnetic properties such as e.g. higher values of the remanent induction and of the levitation force enable the construction of e.g. magnetic bearings having larger gaps between the superconducting components and the permanent magnets or the electromagnets. In the case of motors incorporating superconducting components for example, greater unbalances or deviations from the ideal run of the rotors can thereby be permitted. In the case of the bearing arrangement for the inertial mass in flywheel storage devices based on such bearings, the safety reserves can be increased, and simpler bearing geometries, which are more economical and technically less complicated to construct, can be accepted due to such an enlargement of the gap.

There is a need for shaped bodies having good superconducting and magnetic properties as well as adequate mechanical stability but which, in addition, should possibly not have too great a volume of the shaped body for a given value of the remanent induction and thus exhibit the highest possible value of magnetising force, whereby they can be more easily fitted in the corresponding apparatus. Above all, there is a need to produce strong magnets for the temperature range extending up to 77 K, the temperature of fluid nitrogen, which, on the one hand, use shaped bodies having surface areas of just a few square centimetres, but which, on the other hand, use considerably larger, possibly segmented, shaped bodies such as e.g. rings.

One way of increasing the remanent induction of such a shaped body could lie in the enlargement of the magnetic domains by processing larger, single domain shaped bodies. However, due to the very low growth rates in the phase (Y/Rare Earth)$_1$Ba$_2$Cu$_3$O$_{7-x}$ (=phase 123), this is associated with very long processing times. In addition, the growth front in shaped bodies based upon (Y/Rare Earth) BaCuO having an extensively homogenous starting composition becomes unstable with grains of increasing size. Morita et al., Mater. Sci. Eng. B53, 1998, 159–163 counteracts this by using shaped bodies having deliberately arranged non-homogenous starting compositions in which an intense chemical gradient is produced in the shaped body. Shaped YBaCuO bodies having a large surface area, Dy-containing shaped body placed thereon were produced. In turn, a crystal nucleus containing Sm was seated on the Dy-rich shaped body. Hereby, maximum values of the remanent induction of 1080 mT at 77 K and 0 T were achieved. In this process, the Dy-rich shaped body is initially texturised. Thereafter, this shaped body serves as a large surface area crystal nucleus for texturising the Y-rich shaped body. This means that two complete texturising processes, together with all of the necessary process steps associated therewith, must be carried out here, this thereby resulting in a considerable increase in the processing time.

Moreover, it is known from the production of shaped bodies having a Y basis that a complete intergrowth of the central grain can only rarely be achieved. In general, this central grain is surrounded at the sides and below by a non-texturised layer of approximately 1 to 2 mm thickness in which the particles that have been displaced forwardly by the growth front solidify in the residual smelt. It is assumed that this was also the case when growing Dy-rich shaped bodies by the methods described by Morita et al. In such cases, it is not possible to effect the texture transfer process from the Dy-rich shaped bodies to the Y-rich bodies. The Y-rich shaped body would then grow polycrystalline and exhibit correspondingly poor superconducting properties. In the case of this process, there was then a very high rejection quota.

The production of suitable preliminary materials for the process and also the processing of the combined shaped bodies are very complicated procedures and introduce an additional lengthening of the processing times. Moreover, for some applications, it is necessary to keep the size of the superconducting shaped bodies as small as possible, especially if they are to be fitted into existing constructions of apparatus.

An enlargement of the magnetic domains without increasing the size of the shaped body can also be achieved in the case of shaped bodies incorporating cracks or/and other point defects by healing such point defects using the method described in the German patent application 198 41 925.2. By virtue of the reference thereto, this patent application is considered to be included in full in the present application.

Furthermore, shaped bodies based upon SmBaCuO are known from Ikuta et al., Supercond. Sci. Techn. 11, 1998, 1345–1347, these bodies containing a high proportion of Ag$_2$O and having a remanent induction of up to 1700 mT. However, such an Sm-rich superconducting material can only be produced with great difficulty and in the absence of air since the superconducting phase Sm-123 is not stable under such conditions. The production of the shaped body must therefore be undertaken in a protective gas atmosphere having a very low partial pressure of oxygen. Furthermore, a comparison with YBaCuO type shaped bodies was drawn in FIG. 2 of this publication, the remanent induction thereof being not even half as large as that of shaped bodies based upon SmBaCuO.

Consequently, the object of the invention is to propose a method by means of which such superconducting materials having a high remanent induction, a high levitation force or/and a high critical transport current density can be produced. Furthermore, it is advantageous if these shaped bodies can be produced in as simple and reliable a manner as possible.

This object is achieved by a method for the heat treatment of shaped bodies made of a superconducting material based on (Y/Rare Earth)BaCuO, which is characterised in that a coating consisting of a coating material is applied to at least one part of the surface of the shaped body, whereby the coating material melts at least partially at a lower temperature than the material of the shaped body or/and is flowable at a lower temperature than that material and, possibly hereby, flows out over the surface of the shaped body, whereby the shaped body together with the applied coating material is heated to a temperature at which the material of the shaped body does not yet melt or/and is not yet flowable but at which the coating material is at least partially softened by the heat or/and is in a flowable state, and whereby at least one part of a region of the shaped body located near the surface is modified at this temperature or/and during a succeeding cooling process in that the coating material infiltrates partially or at least partially into the region of the shaped body located near the surface, and wherein the shaped body treated in such a manner is enriched with oxygen during the cooling process or/and during a succeeding heat treatment whereby the modification contributes to the increase in remanent induction or/and to the increase in critical current density of the shaped body enriched with oxygen.

The superconducting material has at least one superconducting or superconductive phase, whereby the superconductive phase will become a superconducting phase when appropriately enriched with oxygen. It preferably contains at least one Rare Earth element (including lanthanum and yttrium) and also at least barium, copper and oxygen and possibly too, elements selected from the group consisting of Be, Mg, Ca, Sr, Zn, Cd, Sc, Zr, Hf, Pt, Pd, Os, Ir, Ru, Ag, Cu, Au, Hg, Ag [sic], Tl, Pb, Bi and S. Hereby, the trivalent elements preferably serve as replacements for yttrium and the bivalent ones preferably serve for modulating the electron structure or as a partial replacement for barium. In the sense of this application, the Rare Earth elements Rare Earth also include lanthanum and yttrium. Amongst the Rare Earth elements, Y, La, Ce, Nd, Sm, Pr, Eu, Gd, Yb, Dy, Er are preferred, whereby Ce, Pr and Sm are preferred only in the form of components of mixed crystals in addition to other Rare Earth elements. Hereby, Cer [sic] may serve for refining the particles in the 211 phase and similar pinning centres. Y, Yb, Dy, Er and Nd are particularly preferred.

It is preferred that a material for the shaped body or/and a coating material be selected from the group of materials based on Y—Ea—Cu—O, (Y/Rare Earth)—Ea—Cu—O, Rare Earth—Ea—Cu—O, whereby Ea stands for at least one alkaline earth element, and whereby proportions of these chemical elements may be substituted by other unmentioned ones.

High temperature superconducting materials suitable for use in the method in accordance with the invention are those in which the superconducting material of the shaped body that is to be modified or that has been modified or/and the coating material includes phases which are selected from the group of phases having an approximate composition of $Y_1Ba_2Cu_3O_v$, $Y_2Ba_1Cu_1O_w$, $Yb_1Ba_2Cu_3O_{v'}$, $Yb_2Ba_1Cu_1O_{w'}$, $Sm_1Ba_2Cu_3O_{v''}$, $Sm_2Ba_1Cu_1O_{w''}$, $Nd_2Ba_2Cu_3O_{v'''}$, $Nd_4Ba_2Cu_2O_{w'''}$, $Dy_1Ba_2Cu_3O_{v''''}$, $Dy_2Ba_1Cu_1O_{w''''}$, $Er_1Ba_2Cu_3O_{v''''}$, $Er_2Ba_1Cu_1O_{w''''}$, $Eu_1Ba_2Cu_3O_{v'''''}$, $Eu_2Ba_1Cu_1O_{w'''''}$, $Gd_1Ba_2Cu_3O_{v'''''}$, $Gd_2Ba_1Cu_1O_{w'''''}$, $Y_2O_3$, $CeO_2$, Pt, $PtO_2$, Ag and $AgO_2$, where Y, Yb, Sm or/and Nd may also be partially substituted by other lanthanides including Y, and wherein Ag, $AgO_2$ or/and other related chemical elements may also occur.

It is known that all of these superconducting materials often have a composition which differs significantly from the stoichiometry of the respective generic formula. Basically, the composition of these phases and the substitution by other chemical elements is known to the skilled person.

The untreated or/and the treated shaped body of the superconducting material, the coating material or/and the layer of material may additionally comprise calcium or/and other cations which alter the band structure of the electrons and contribute to a higher critical transport current density. The shaped body of the superconducting material or/and the coating material may also comprise at least one gradient in regard to the chemical composition, the grain structure or/and the peritectic flow or melting temperatures.

In the sense of this application, grains (=so-called crystallographic "domains") are separated from one another by at least one grain boundary or/and have differing crystallographic orientations.

In the sense of this application, magnetic domains are separated from one another by at least one domain boundary, whereby the domains may be orientated in the same manner and may even appertain to a single grain, whereby the domain boundary is formed between two different magnetic regions, possibly merely by a defect such as a crack (=domain boundary). Hereby, the magnetic domains do not necessarily correspond to the regions or aligned magnetic moments as is usually the case with permanent magnets, but rather, they are oriented in accordance with the conditions of the field being used for magnetising purposes. In this application, the magnetic domains are referred to hereinafter merely as "domains".

The aim behind the further development and optimisation of shaped bodies of this type, is that of producing the highest possible value of remanent induction and critical transport current density since this will thereby enable the smaller shaped bodies that have been modified in accordance with the invention to be used for similar technical applications. In the event that the shaped body exhibits a non-homogeneous distribution of superconducting properties, especially in the edge regions, following the texturising process, then the shaped body must be modified more intensely or in a special manner, especially in the edge regions, utilising the method in accordance with the invention in order to achieve a homogenous distribution of the superconducting properties.

Shaped bodies forming the preliminary material for the method in accordance with the invention which are provided with just one grain or just a few grains or with just one magnetic domain or with just a few magnetic domains, are preferably produced in a modified melt-bulk-growth process such as e.g. in the melt-textured-growth process, in a top-seeded-melt-growth process using an upwardly situated crystal nucleus, in a zone melting process such as the vertical-gradient-freeze process or in a single crystal growth process such as e.g. the modified Bridgeman process. Shaped bodies which are produced by one of these processes sometimes exhibit just one to six magnetic domains. If such samples exhibit cracks or/and impurities or structurally damaged regions, these defects can be filled or/and healed, and even the split magnetic domains could also be healed.

These processes, which serve for producing a preliminary material based upon (Y/Rare Earth)BaCuO for the method in accordance with the invention, usually have the following simplified features in common:

Initially, the e.g. pre-sintered shaped body based on (Y/Rare Earth)BaCuO is heated to a temperature which lies above the peritectic temperature or melting temperature of the corresponding preliminary material. This temperature is maintained until such time as the whole of the preliminary material has been converted into the partially molten state in which the e.g. $Y_2Ba_1Cu_1O_5$ phase is in equilibrium with a Ba— and Cu—rich smelt. The processing section following thereupon may be the actual texturising step. It determines the growth rate of the grains and hence the grain structure of the resulting shaped body. The differences between the individual processes now appear. Thereafter, the cooling process common to all of these processes is effected whereby the temperature is returned back to room temperature. During this cooling action, enrichment with oxygen can take place, above all, during a slow cooling process in the temperature range of approximately 500 to 350° C., or, with a dwell period whilst in this temperature range, using a flowing oxygen-rich stream of gas. Otherwise, the shaped body must be enriched with oxygen following the texturising process in at least one further heat treatment. The grain structure of the thus produced shaped body is formed from one or more grains in dependence on the process. The grains themselves are composed of plates which are separated from one another by small-angle grain boundaries of less than 1°. In dependence on the manufacturing process and the composition of the starting material, ball-like or needle-like particles of phase 211 having diameters of approximately 100 nm to 100 μm are distributed throughout the whole of the shaped body. The characteristic method steps and features of the most important texturising processes are discussed hereinafter:

1.) The Melt-textured-growth-process (MTG):

This process is a non-directional texturising process without spatial temperature gradients. The texturising effect occurs mainly by slowly cooling the shaped body from the partially molten state down to temperatures below the peritectic or melting temperatures. During this cooling step, grains e.g. of the phase $(Y, Rare Earth)_1Ba_2Cu_3O_{7-x}$ are formed, the size and the number thereof per unit volume (=number density) is heavily dependent on the selected cooling rate. The crystallographic orientations of these grains are mainly distributed in unregulated manner whereby many large-angle grain boundaries may be present in the shaped body.

2.) The Vertical-gradient-freeze-process (VGF):

This process is a directional melt-texturising process. A static oven built-up of e.g. eight individually controllable zones is controlled in such a manner that a temperature profile is formed along the sample which is likewise maintained stationary. Here, the vertical temperature gradient may amount to e.g. 25 K/cm. Frequently, an approximate cooling rate of 1 K/h is used in the vicinity of the peritectic temperature or melting temperature. The melt-texturised shaped body thereby ensuing contains a plurality of grains in the first melted region due to the unregulated formation of crystal nuclei. Hereby, during the growth of the grains following the formation of the crystal nuclei, it is those grains whose c-axes are substantially parallel to the temperature gradient prevailing during the process that are successful. The differences in the orientations between such preferred growing grains may amount thereby to approximately 15°.

3.) The Modified Bridgeman Process:

In this process, the sample can be moved, preferably vertically, in relation to a static oven which often consists of three zones. Hereby, the sample may be supported either by a suitable mounting construction such as that provided e.g. by a crucible, or it may be hung on a pulling device. Typically, the temperature of the upper zone often amounts to approximately 850° C., that of the middle zone to approximately 1150° C. and that of the lower zone to approximately 750° C. In the vicinity of the peritectic temperature, a gradient of approximately 20K/cm for example is produced, whereby the sample may be passed therethrough at a speed of e.g. 1 mm/h. This then corresponds to a cooling rate of approximately 2 K/h.

The cylindrical samples are often approximately 12 cm long and frequently have a diameter of approximately 6 mm. Below an approximately 2 to 3 cm long crystal nucleus forming zone, in which differently oriented grains compete in the growth process, the samples are usually of a single domain nature and thus inevitably comprise just one grain. The c-axis in this single domain region is frequently inclined at approximately 45 relative to the axis of the sample.

4.) The Top-seeded-melt-growth-process (TSMG):

This process enables crystallographic single domain shaped bodies to be produced having a crystallographic orientation which may be predefined by the orientation of the appropriate seed crystal (crystal nucleus) that is to be placed on the surface of the preliminary material. Hereby, the seed crystal must consist of a material which will still be present in crystalline form at temperatures above the peritectic or melting temperature of the material being texturised. In order to control the orientation, the lattice parameters of the seed material must approximate to those of the material being texturised. Thereby, the crystal nucleus may be set in place prior to the actual texturising step by being pressed-in, sintered or simply by the placement thereof, or the application thereof may be effected during the texturising process by placing it on the previously heated sample.

The preliminary material provided in this manner with a crystal nucleus, is converted into a partially molten state and is cooled rapidly to a temperature below the peritectic or melting temperature of the material being texturised, whereby, at this temperature, the formation of crystal nuclei and a growth process especially of grains of the phase $(Y, Rare Earth)_1Ba_2Cu_3O_{7-x}$ starts to occur in direct contact with the seed crystal, the sub-cooling in other regions of the shaped body not being sufficient for the formation of crystal nuclei and the growth of the grains. At this temperature, a dwell period is frequently selected in the temperature profile so as to stabilise the growth rate of the central grain. The temperature profile adopted thereafter must be directed above all at removing any ensuing heat of crystailisation and maintaining the stable growth rate of the central grain whilst suppressing the growth of further grains. This can be achieved by using a sufficiently slow cooling process and/or by inserting further dwell periods.

The samples produced in this way consist of a single grain whose orientation substantially corresponds to that predefined by the seed crystal. In general hereby, an orientation of the c-axis perpendicular to one of the faces of the geometry of the shaped body is preferred. The substructure of these grains is formed substantially of plate-like grains as is the case in the other processes for making a preliminary material, these grains being separated from one another by small-angle grain boundaries of less than 1°.

The heat treatment process in accordance with the invention:

The superconducting properties such as remanent induction, levitation force and/or the level of the critical current density of the shaped body obtained as aforesaid and serving as the preliminary material for the heat treatment process in accordance with the invention by modifying the surface of the shaped body can be improved by means of the subsequently described heat treatment process.

To this end, a coating material, which flows out at least partially during the firing process or possibly even spreads out over the surface of the shaped body, is applied to the shaped body.

For selecting the material of a crystal nucleus, or that of a superconducting material, or that of a coating material which is converted into the layer of material during the firing process or which can be chemically identical therewith, and that of a layer material, one utilises the following temperature sequence whereby the respective peritectic or meting temperature is meant by T and whereby the use of a crystal nucleus only serves for producing a suitable preliminary material for the heat treatment process in accordance with the invention:

$$T_{crystal\ nucleus\ material} > T_{superconducting\ material} > T_{layer\ material}$$

The following peritectic or melting temperatures (Table 1) apply as an approximation for the phases of the general composition $(Y, Rare\ Earth)_1Ba_2Cu_3O_{7-x}$:

| (Y/Rare Earth) | Tp (° C.) |
|---|---|
| La | 1090 |
| Nd | 1090 |
| Sm | 1060 |
| Eu | 1050 |
| Gd | 1030 |
| Dy | 1010 |
| Y | 1000 |
| Ho | 990 |
| Er | 980 |
| Tm | 960 |
| Yb | 900 |
| Lu | 880 |

Table 1 basically serves as a guideline for selecting suitable pairings of elements. However, mixtures of different elements, the employment of pressure or low pressures, the content of substances which reduce the melting point or the peritectic temperature, and especially the partial pressure of oxygen may result in a considerable alteration in the temperature values and may also produce an alteration in the sequence displayed in Table 1.

As the preferred pairings, for the elements involved in Y/Rare Earth, one obtains the following pairings for the temperature sequence and for the selection of the materials which mainly contain phases of the general composition $(Y,Rare\ Earth)_1Ba_2Cu_3O_{7-x}$ (Table 2):

| Crystal nucleus | Superconducting material | Layer material |
|---|---|---|
| Nd > | Sm > | Dy |
| Nd > | Dy > | Y |
| Nd > | Y > | Yb |
| Nd > | Sm > | Yb |
| Sm > | Y > | Yb |
| Sm > | Gd > | Y |
| Eu > | Dy > | Er |
| Eu > | Y > | Yb |
| Gd > | Y > | Yb |
| Dy > | Er > | Yb |

The Table does not take into account the fact that the superconducting material may have a somewhat different composition and exhibit different properties prior to the treatment with a crystal nucleus than it has after the seed has been introduced. In this case too, it is only the modification of the superconducting material by the layer material that appertains to the invention.

The coating material is applied such as to produce a layer thickness which is preferably in the range of from 1 $\mu$m to 5 mm, particularly preferred is in the range from 10 $\mu$m to 3 mm, and most preferably preferred is in the range from 50 $\mu$m to 2 mm.

The coating material which is envisaged for coating at least a portion of the surface of the shaped body that is to be modified may be applied in the form of a powder, a shaped body or/and a coating; the shaped body is preferably in the form of a compressed, a calcinated, a sintered or a molten, and possibly a texturised or a melt-texturised shaped body; and the coating is preferably provided in the form of a physically or/and chemically deposited coating that is basically produced by precipitation, dissolution reactions, spraying or spray-pyrolysis, whereby the deposition may be effected by e.g. laser ablation, gas-phase deposition, sputtering, cathodic sputtering, atomisation, CVD, PVD, or Sol-Gel processes. Hereby, oxides, hydroxides, carbonates, nitrates and similar precursor materials such as citrates and oxalates may be used, although other materials for lowering the melting point such as halogenides and especially fluorides may also be used. Especially in the case where, in comparison with the superconducting material, materials of a substantially specific nature are being used, it is necessary that the coating material should have a lower melting point or peritectic point than the superconducting material being modified, for which reason it is recommended that one should use a supplement with the aid of which the melting point can be reduced or the peritectic temperature lowered.

A powder-like coating material, amongst which, one would count a single phase or multi-phase powder, a powder mixture or/and a granulate, can, inter alia, be spread over or painted on; a shaped body of the coating material can be placed on or adhered to the corresponding surface of the shaped body of the superconducting material; e.g. the coating for the shaped body being modified could be effected from the gas phase or by using an aerosol.

The coated shaped body of the superconducting material may be maintained at a temperature at which the material of the shaped body does not yet melt or/and is not yet flowable but at which the coating material is at least partially softened by the heat or/and is in a flowable state, and whereby at least one part of a region of the shaped body located near the surface thereof is modified at this temperature or/and during a succeeding cooling process, so that a portion of the coating material can penetrate or diffuse into the superconducting material being modified.

Hereby, surface defects e.g. pores, cracks and microcracks which may be present in the region of the surface being modified, can also be closed and a strong denticulation effect can be made to occur at the bordering surfaces by chemical or physico-chemical reactions. Furthermore, certain elements may also diffuse deeper into the superconducting material being modified. In certain circumstances, the coating material can diffuse-in or penetrate to a very great extent and possibly, although to a lesser extent, be vaporised so that, in the case of thinner coatings, it is possible that only a very thin residual layer or even no residual layer at all will remain on the modified shaped body after the firing process. During the modification of the superconducting material, a gradient may be produced in the shaped body of the superconducting material on the one hand or/and in the layer of material produced from the coating material on the other, e.g. a gradient in the form of a certain element which can also gradually affect the properties of the material.

A pyramid having very flat slopes frequently builds up on the modified surface of the shaped body during the firing process due to the modification and crystallisation processes. Thereafter, the residual crystal nuclei, the layer of material which takes the form of a very flat pyramid of grown crystal surfaces, or/and the uneven surface of the thus produced shaped body is preferably mechanically removed e.g. by sawing, grinding, lapping or/and polishing, and then, it is subjected, if necessary, to a subsequent heat treatment which can serve for the oxygen enriching process or/and the healing of the material.

The shaped body being modified preferably has a relative thickness of at least 80%, and especially preferred of at least 95%, although, in exceptional cases, shaped bodies of lesser thickness may also be of advantage if they have been treated in accordance with the invention.

The shaped body of the superconducting material can be positioned during the firing and heat treatments in such a manner that, apart from the coating material, it is only in direct contact with a material based on (Y/Rare Earth) BaCuO, and preferably, a material having phases based on $Y_2BaCuO_5$. This helps to prevent contact reactions and a partial deliquescence of the superconducting shaped body during the firing process or the occurrence of mechanical stresses. Lightweight refractory bricks and combustion agents based on MgO or $Al_2O_3$ are therefore less suitable here.

The cooling process occurring after or during the modification of the superconducting material or during a subsequent heat treatment should be effected as slowly as possible so as to prevent the formation of cracks, micro-cracks and flaking, and should preferably be effected at a rate slower than 30 K [sic].

The shaped body can be enriched with oxygen during the cooling process or/and during a fresh heat treatment in order to produce or/and to improve the superconducting properties. The modification of the superconducting material may lead to the formation of defects in the crystal lattice of the shaped body which contribute to the increase in the magnetic properties. Hereby, these might be point defects, and especially voids due to the insertion of too large or too small cations into the usually tetragonal perovskite crystal lattice, vacancies, grain boundaries, although however, it could also lead to alterations in the pore structure.

In a preferred embodiment, and above all when a shaped body comprises only one grain or just a few grains or/and even only one magnetic domain or just a few magnetic domains, a possibly present crack, a grain boundary or/and a region that has been structurally damaged or contains impurities can be removed, in particular, by sawing, whereby the region removed is thereafter treated during the further processing in accordance with the invention in analogous manner to that used for a region which is to be modified. Amongst other things, it is thereby possible to completely heal and modify defective shaped bodies, or to produce especially large shaped bodies having better properties then is technically possible at the present time.

Hereby, the method in accordance with the invention can be implemented in an advantageous manner such that, at high temperatures, the flowable coating material will penetrate at least partially into a crack or/and into a region of the shaped body that has been removed by e.g. a saw cut, when such a crack or region is present in the surface region that is to be modified.

Preferably, the shaped body of the superconducting material comprises only one to one hundred grains or/and one to one hundred domains prior to the modification and heat treatment processes so as to reduce the number of grains or domains insofar as possible down to one to eight during the modification, or possibly, during the subsequent heat treatments. However, the larger the volume of the shaped bodies, the more grains or domains they could contain. It is possible therefore, to start with a texturised polycrystalline shaped body having a very large number of grains.

Preferably, the shaped body of the superconducting material will comprise only one to one hundred grains or/and one to one hundred domains following the modification and a possible heat treatment, and especially comprises up to 50, and more preferably just one to 20, but most particularly preferred is just one to eight grains or domains or even just one grain and up to four domains.

Basically, any geometrical shape of the shaped bodies is suitable for employment in the method in accordance with the invention, or for technical employment in the forms thereof following the modification. Preferred and those made use of at the present time, are those which are substantially in the shape of plates, disks, parallelepipeds, solid cylinders, hollow cylinders, rings, tubes, bars, tapes, wires or coils, whereby variations of angle, edge breaks, rounding of the edges, additional recesses such as e.g. borings and grooves as well as additional projecting items such as lugs, noses and similar geometrical modifications could occur. Plates may exhibit a quadratic or rhombic horizontal projection.

A large-sized shaped body of the superconducting material may comprise a plurality of mutually spaced crystal nuclei whose crystallographic c-axes are advantageously oriented either substantially parallel to one of the main directions of the geometry of the shaped body e.g. substantially parallel to the cylinder axis of a cylinder, or are substantially at right angles thereto. This has the advantage, that the preferred orientation of the c-axis, to which the plane of particularly high superconductivity is at right angles, is arranged such that a higher critical transport current density will be reached due to the alignment in the direction of flow of the electrical current, that a larger current can flow, and that a greater level of magnetisation is obtained. The orientation of the crystal in the shaped body being modified can be controlled by the crystal orientation of the crystal nucleus. In the case of a tube or ring, it is then also possible to produce an alignment of the c-axis in the radial direction by appropriate arrangement of a plurality of crystal nuclei, so that the plane of greatest superconductivity will lie in the wall of the ring and thus can be optimally matched to the desired use. However, this presupposes that a new domain or/and a new grain is present around the axis of the cylinder in order to be able to match the orientation in correspondence with the curvature of the shaped body. Such shaped bodies then inevitably require a somewhat higher or even substantially higher number of domains or grains e.g. six to twenty-four, in dependence on their size.

A large-sized shaped body of the superconducting material can be produced advantageously in the form of a plurality of segments, which are possibly mutually matched or, even better, jointed together. The jointing process can be effected, in particular, by heat treatment at a temperature at which the material of the shaped body does not yet melt or/and is not yet flowable but at which the coating material is at least partially softened by the heat or/and is in a flowable state, and whereby at least one part of a region of the shaped body located near the surface is modified at this temperature or/and during a succeeding cooling process, possibly by the application of pressure and possibly by the addition of a coating material to the boundary surfaces that are to be jointed together, or even by a simple gluing process for example.

In the case of shaped bodies whose surfaces must have a certain surface quality e.g. an average roughness value $R_a$ of a certain size or which, in the form of functional surfaces, must have a certain shape of the Abbot loading curve, or wherein the geometries thereof require that certain magnitudes of length, angles or/and shape and positional tolerances such as e.g. flatness or parallelism ought to be maintained, it is frequently necessary for the shaped body to be given a mechanical surface treatment following the cooling process e.g. by grinding, lapping, polishing or/and barrel-polishing. Hereby, it may also be useful to provide for rounding or chamfering of sharp edges by means of a grinding process, or to round them by means of a barrel-polishing process.

Furthermore, the object of the invention is achieved by means of a shaped body consisting of a superconducting material based on (Y/Rare Earth)EaCuO which is obtainable by a method in accordance with at least one of the claims 1 to 17, and which contains at least one Rare Earth element selected from the group consisting of Y, La, Ce, Pr, Nd, Eu, Gd, Tb, Dy, Ho, Er, Tm, Yb and Lu, and which has a maximum value of remanent induction at 77 K and 0 T of at least 1100 mT, preferably of at least 1200 mT, and even more particularly preferred of at least 1300 mT, and above all, of more than 1400 mT.

Preferably, the shaped body is a cylinder, a ring, a tube or a disc consisting substantially of one or more segments wherein the alignment of the c-axes of the grains or of the one grain is substantially in line with the axis of the cylinder/the axis of the plate, or with another main direction of the shaped body, or, it is at right angles thereto.

The shaped body may be characterised in that it substantially comprises a composition of $(Y/Rare\ Earth)_1Ba_2Cu_3O_x$ where x lies in the range from 6.5 to 7 and wherein Y or/and Rare Earth may be in excess. It advantageously consists to more than 60 Vol.-%, and particularly preferred, to more than 70 or to more than 80 Vol.-% of one phase of the composition $(Y/Rare\ Earth)_1Ba_2Cu_2O_x$ where x lies in the range from 6.5 to 7. If the component of the 211-phase is too small however, then the superconducting properties may become worse.

The shaped body may have a critical transport current density of at least $4\times10^4$ A/cm$^2$ in the external field of 1 T at 77 K, preferably of at least $6\times10^4$ A/cm$^2$, and particularly preferred of at least $8\times10^4$ A/cm$^2$, but more especially, of at least $9.7\ 10^4$ A/cm$^2$. It may also have a fracture toughness as determined by the fracture system about the hardness impressions of at least 1 Mpa $\sqrt{m}$, preferably of at least 1.5 Mpa $\sqrt{m}$. Furthermore, it may have a bending strength of at least 300 Mpa and preferably of at least 400 Mpa.

By virtue of the method in accordance with the invention, it was possible, without problems, to modify (=to heat treat) single domain shaped bodies having a diameter of e.g. 45 mm and a height of 12 mm as well as those in the form of e.g. 40×40×12 mm square plates.

The shaped bodies produced in accordance with the invention may be made use of, for example, in transformers, current breakers, power leads, magnetic screenings, magnetic bearings or/and as magnets utilisable for different purposes.

DRAWINGS

The Figures depict the distribution of the magnetic remanent induction in respect of Example 1.

EXAMPLES

The test methods will be explained hereinafter and the invention will be presented in exemplary manner on the basis of selected embodiments

Test Methods

Measuring the distribution of the remanent magnetic field:

The superconducting shaped body that is to be magnetised was firstly raised to temperatures above its transition temperature in the field of a conventional electromagnet. Hereby, the magnetic field penetrated completely into the shaped body which is not superconducting in this state. The superconducting shaped body was then cooled to below its transition temperature $T_c$, in general at approximately 77 K, and thereafter, the field of the electromagnet was completely run down. A portion of the magnetic flux, the remanent induction, thereby remained frozen in the superconductor. The measurement of the distribution of this remanent induction was effected by scanning the surface of the shaped body by means of a micro-Hall-probe type HHP-VA from the company Arepoc. The active surface of the probe was usable down to a temperature of 4.2 K. The measurements were usually only carried out at 77 K. In order to prevent the probe from coming into contact with the surface of the shaped body during the measurement, it was kept recessed into a PTFE mounting. The minimum spacing between the probe and the surface of the shaped body during the measurement thereby amounted to 0.3 mm. The maximum value of the remanent induction was detected at this spacing. The scanning of the surface of the shaped body for determining the distribution of the remanent induction was carried out at a spacing of 0.5 mm.

The PTFE mounting was connected via a stainless steel bar to a 3D positioning system. The control unit for the 3D positioning system was a CNC controller type C116-4 from the company Isel, which could be controlled via an RS 232 interface of a PC. The stepping motor could be positioned reproducibly with a minimum step length of 10 μm. The maximum path length in the X- and Y-directions amounted to 32 cm, and in the Z-direction to 28 cm.

For the purposes of measuring the levitation force of the superconducting shaped body, a permanent magnet was lowered from a height of 100 mm in steps of 0.5 mm onto the surface of the shaped body which was cooled to 77 K, and then returned to its starting position. The magnet used thereby was a cylindrical SmCo magnet having a diameter of 25 mm, a length of 15 mm and a remanence at the surface $B_z(O)$ of 0.4 T in correspondence with the standards issued by the technical committee "Superconducting materials" of the Deutschen Gesellschaft fur Materialkunde (DGM). The positioning process was effected using the positioning system described in connection with the process for measuring remanent induction. The mechanical test-variable, force, was converted into an electrical variable for the PC supported data capture process. A wire strain-gauge sensor of the type (DMS) KAP-S 0,05 from the company AST Dresden GmbH was used for this purpose. This sensor was driven at its maximum possible voltage of 10 V; the permissible limiting force amounted to 150 N. Read-out of the test data from the sensor was effected by means of a digital multimeter which could be read-out by the PC via an RS232 interface.

The measurement of the fracture toughness could be effected by evaluating the crack pattern produced by a Vickers hardness testing body. In this process, which can only be used for brittle materials, the length and the configuration of the cracks occurring during the hardness testing procedure were related to the test load being applied and the determined hardness of the material. Hereby, the hardness impressions were produced by means of a Leitz Durimed 2 small-load hardness tester under loads of between 10 g and 500 g, whereby the dwell period of the test body on the surface was 15 s. The evaluation of the crack system was effected using a scanning electron microscope.

Measurement of the critical transport current:

The critical transport current densities were determined using the conventional four point method. Hereby, pulsed currents having a pulse duration of 1 msec are supplied by the probe (cross-sectional area 0.25 mm$^2$) at a strength of up to 400 A. Low resistance silver contacts (0.04 mOhm) were burnt into the probe for contact making purposes.

Example 1

A shaped body of composition $Y_1Ba_2Cu_3O_{7-x}$, which additionally contained 25 mol % $Y_2O_3$ and 1 Gew. % $CeO_2$, was obtained, at temperatures of up to 1045° C., using a melt-growth process having an upwardly situated crystal nucleus (top-seeded-melt-growth TSMG). The grain structure consisted of YBCO 123 having a high density of the finest particles of YBCO 211.

Figure 1:
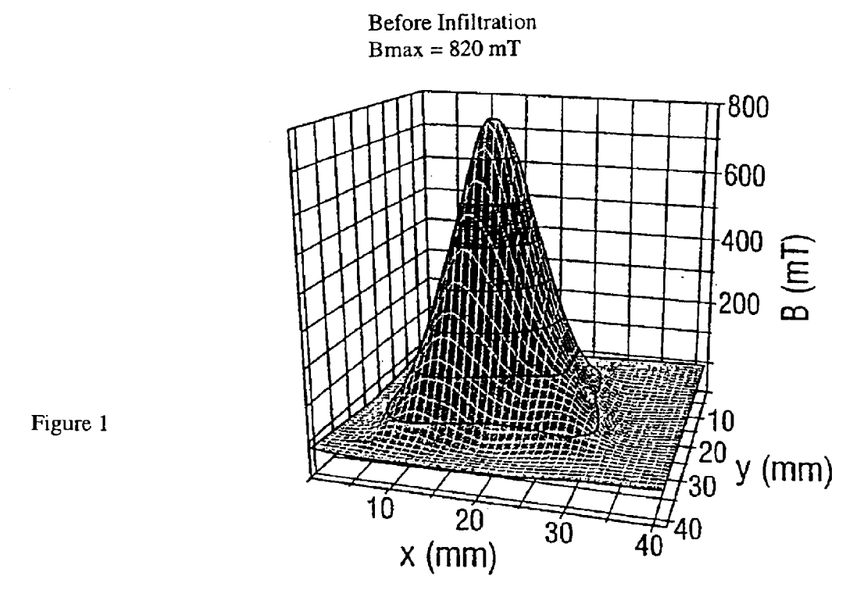
FIGS. 1 and 3 indicate the test results for the preliminary material and FIGS. 2 and 4 the test results for the superconducting material that has been heat treated in accordance with the invention.

The dimensions of the finished texturised plate-like shaped body amounted to 34×34×12 mm. The shaped body did not comprise any macroscopic cracks near the surface following the texturising process. The distribution of remanent induction following the texturising process resulted in a maximum value of the remanent induction $B_{z,max}$ of 820 mT (FIG. 1). The conical geometry of this distribution indicated the single magnetic domain character of the shaped body.

This shaped body was then coated and heat treated by an infiltration process in accordance with the invention: Firstly, a coating material, also referred to as an infiltrate, having a starting composition $Yb_1Ba_2Cu_3O_y$, was converted into a very fine grained powder using a fine milling process and applied by means of a spatula over the whole surface of the shaped body to produce a layer having a thickness of approximately 2 mm. The shaped body together with the coating material was then subjected to the following temperature treatment:

1. heating over 3 h to 900° C.
2. heating over 1 h to 960° C.
3. a dwell period of 25 h at 960° C.
4. cooling over 70 h to 890° C. at a cooling rate of 1 K/h
5. cooling over 25 h to 20° C.

Figure 2:
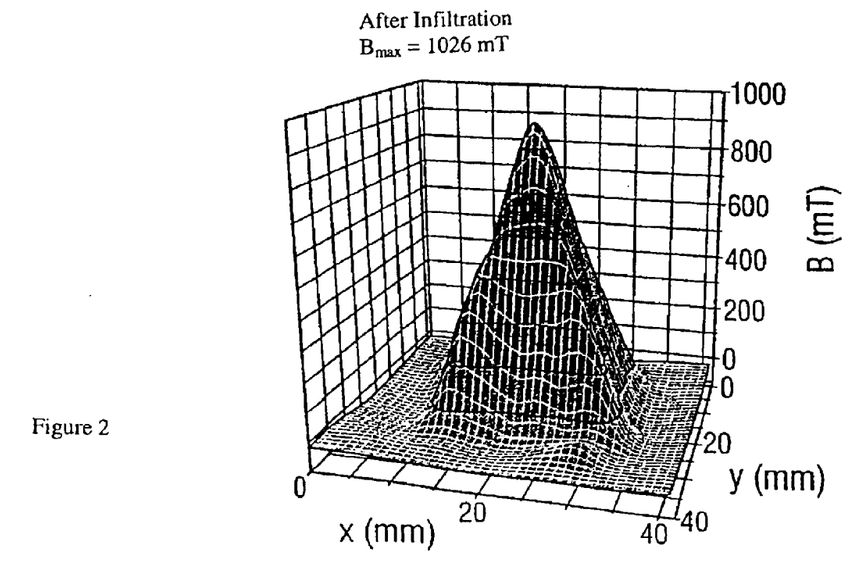

The measured distribution of the remanent induction hereby produced after the infiltration process (=heat treatment) resulted in a maximum value of $B_{z,max}$ of 1026 mT (FIG. 2).

Example 2

Figure 3:
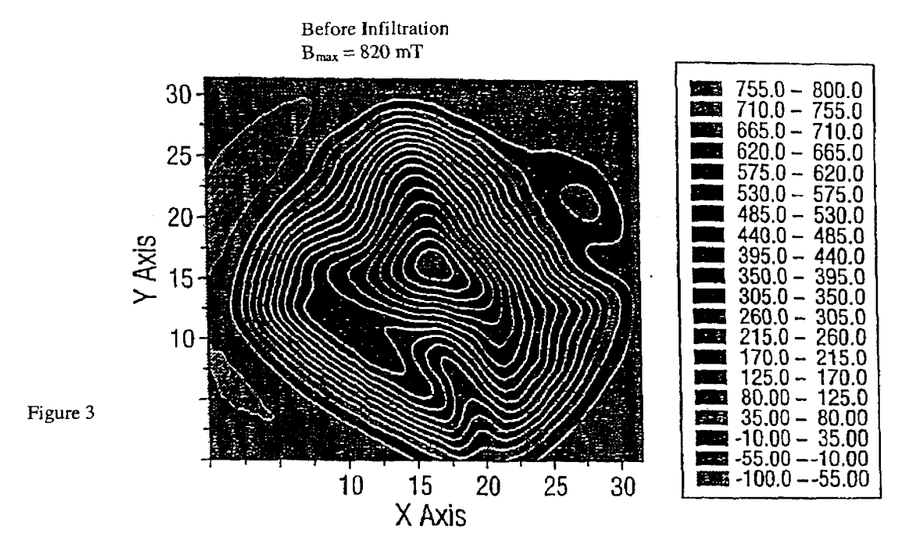

As in Example 1, a texturised shaped body having dimensions of 38×38×12 mm$^3$ was produced. However, diverging from Example 1, Er-123 was used as the coating material. The distribution of the remanent induction following the texturising process resulted in a maximum value $B_{z,max}$ of the remanent induction of 902 mT (FIG. 3).

The shaped body together with the coating material was then subjected to the following temperature treatment:
1. heating over 12 h to 900° C.
2. heating over 3 h to 980° C.
3. a dwell period of 3 h at 980° C.
4. cooling over 2 h to 970° C.
5. a dwell period of 10h at 970° C.
6. cooling over 60 h to 900° C.
7. cooling over 30 h to 25° C.

Figure 4:
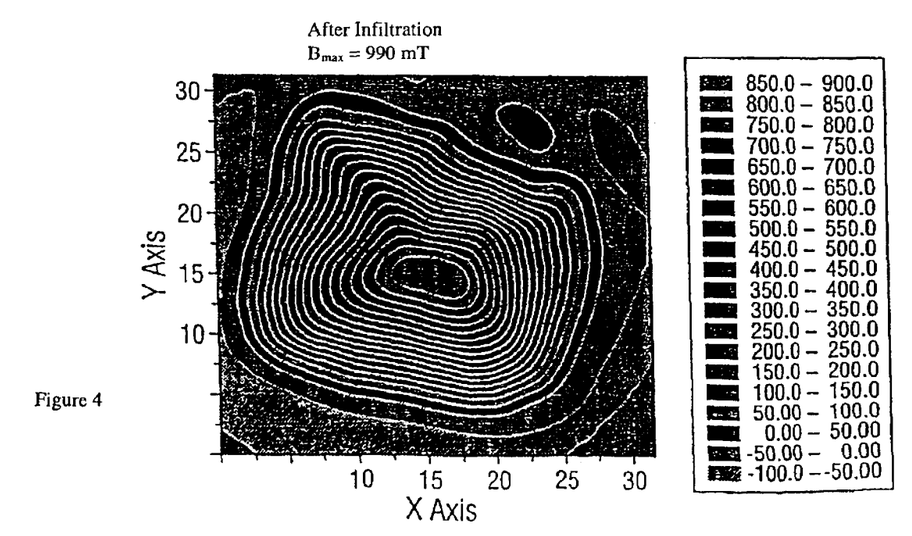
Figure 5:
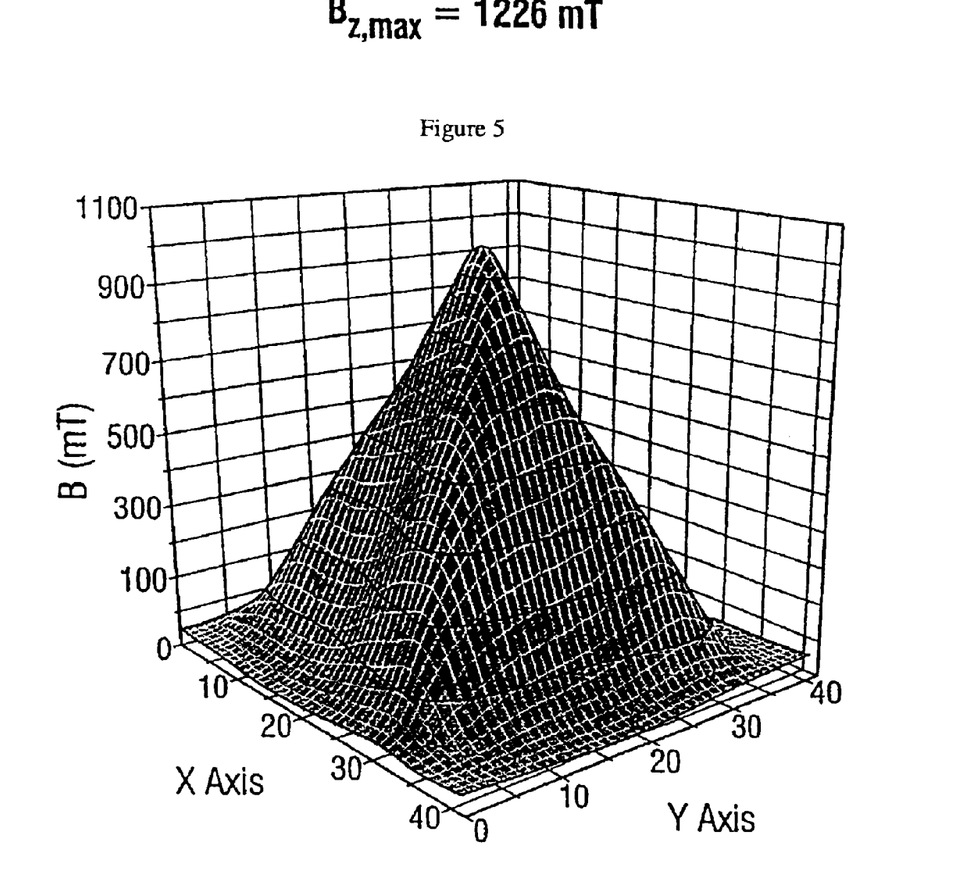
FIG. 5 is a shaped body texturised by the modified TSMG process but not subjected to an infiltration post-treatment.

The measured distribution of the remanent induction following the infiltration process (=heat treatment) resulted in a maximum value $B_{z,max}$ of 990 mT (FIG. 4).

What is claimed is:

1. A shaped body of a superconducting material based on (Rare Earth)BaCuO, wherein Rare Earth signifies at least one element selected from the group consisting of Y, La, Ce, Pr, Nd, Eu, Gd, Th, Dy, Ho, Er, Tm, Yb and Lu, and in that the shaped body has a maximum value of remanent induction at 77 K and 0 T of at least 1100 mT, the maximum value of remanent induction obtained by applying a coating material to at least one part of at least one surface of the shaped body, wherein the coating material melts at least partially at a lower temperature than the material of the shaped body, the shaped body and the applied coating material having been heated to a desired temperature at which the material of the shaped body does not yet partially melt but at least partially softens, the applied coating at least partially infiltrating a region near the surface of the shaped body when that region is modified at a temperature at least as high as the desired temperature, and the shaped body being enriched with oxygen to increase at least one of the remanent induction and the critical current density of the shaped body.

2. A shaped body in accordance with claim 1, characterised in that the alignment of the c-axes of the grains or of the one grain of a cylinder, a ring, a tube or a disc consisting substantially of one or more segments is substantially in line with an axis of the shaped body, or, it is at right angles thereto.

3. A shaped body in accordance with claim 1, characterised in that it substantially comprises a composition of (Rare Earth)$_1$Ba$_2$Cu$_3$O$_x$ where x lies in the range from 6.5 to 7 and wherein at least one element of Rare Earth may be in excess.

4. A shaped body in accordance with claim 1, characterised in that it consists to more than 60 Vol.-% of one phase of the composition (Rare Earth),Ba$_2$Cu$_3$O$_x$ where x lies in the range from 6.5 to 7.

5. A shaped body in accordance with claim 1, characterised in that it has a critical transport current density of at least 4×10$^4$ A/cm$^2$ in the external field of 1 T at 77 K.

6. A shaped body in accordance with claim 1, characterised in that it has a fracture toughness as determined by the fracture system about the hardness impressions of at least 1 Mpa √m.

7. The use of a shaped body consisting of a superconducting material in accordance with claim 1 for transformers, current breakers, power leads, magnetic screenings, magnetic bearings or/and as magnets, especially as cryogenic bearings, in flywheel storage devices, in particle accelerators, in the rotors of electrical machines.

8. A shaped body as claimed in claim 1, wherein said shaped body has a maximum value of remanent induction at 77 K and 0 T of at least 1200 mT.

9. A shaped body as claimed in claim 8, wherein said shaped body has a maximum value of remanent induction at 77 K and 0 T of at least 1300 mT.

10. A shaped body as claimed in claim 9, wherein said shaped body has a maximum value of remanent induction of more than 1400 mT.

11. A shaped body as claimed in claim 4, characterised in that it consists of more than 80 Vol.-% of said one phase of the composition.

12. A shaped body as claimed in claim 11, characterised in that it consists of more than 90 Vol.-% of said one phase of the composition.

13. A shaped body as claimed in claim 12, characterised in that it consists of more than 95 Vol.-% of said one phase of the composition.

14. A shaped body in accordance with claim 5, characterised in that it has a critical transport current density of at least $6 \times 10^4$ A/cm$^2$.

15. A shaped body in accordance with claim 14, characterised in that it has a critical transport current density of at least $8 \times 10^4$ A/cm$^2$.

16. A shaped body in accordance with claim 6, characterised in that it has a fracture toughness as determined by the fracture system about the hardness impressions of at least 1.5 Mpa $\sqrt{m}$.

* * * * *